United States Patent
Chatty et al.

(10) Patent No.: US 8,692,290 B2
(45) Date of Patent: Apr. 8, 2014

(54) SILICON CONTROLLED RECTIFIER STRUCTURE WITH IMPROVED JUNCTION BREAKDOWN AND LEAKAGE CONTROL

(75) Inventors: Kiran V. Chatty, Oviedo, FL (US); Robert J. Gauthier, Jr., Hinesburg, VT (US); Junjun Li, Williston, VT (US); Alain Loiseau, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 171 days.

(21) Appl. No.: 13/226,838

(22) Filed: Sep. 7, 2011

(65) Prior Publication Data

US 2013/0057991 A1    Mar. 7, 2013

(51) Int. Cl.
*H01L 29/73* (2006.01)
*H01L 21/331* (2006.01)
*G06F 17/50* (2006.01)

(52) U.S. Cl.
USPC .................. 257/173; 257/141; 257/E29.181; 257/E21.546; 438/135; 716/110

(58) Field of Classification Search
None
See application file for complete search history.

(56) References Cited

U.S. PATENT DOCUMENTS

| | | |
|---|---|---|
| 5,719,733 A | 2/1998 | Wei et al. |
| 5,856,214 A | 1/1999 | Yu |
| 5,903,032 A | 5/1999 | Duvvury |
| 5,959,332 A | 9/1999 | Ravanelli et al. |
| 6,458,632 B1 | 10/2002 | Song et al. |
| 6,594,132 B1 | 7/2003 | Avery |
| 6,610,262 B1 | 8/2003 | Peng et al. |
| 6,764,892 B2 | 7/2004 | Kunz et al. |
| 6,765,771 B2 | 7/2004 | Ker et al. |
| 6,770,918 B2 | 8/2004 | Russ et al. |
| 6,864,537 B1 | 3/2005 | Mallikarjunaswamy |
| 6,867,957 B1 | 3/2005 | Tong et al. |
| 6,888,710 B2 | 5/2005 | Mallikarjunaswamy et al. |
| 7,285,458 B2 | 10/2007 | Manna et al. |
| 7,601,991 B2 | 10/2009 | Salcedo et al. |
| 7,615,417 B2 | 11/2009 | Manna et al. |
| 7,719,026 B2 | 5/2010 | Lou et al. |
| 7,719,806 B1 | 5/2010 | Boyd et al. |
| 7,888,739 B2 | 2/2011 | Jeon et al. |
| 7,943,438 B2 | 5/2011 | Gauthier, Jr. et al. |
| 2004/0207021 A1* | 10/2004 | Russ et al. ................. 257/355 |
| 2006/0258067 A1* | 11/2006 | Jeon et al. .................. 438/154 |
| 2009/0001472 A1 | 1/2009 | Salman et al. |
| 2010/0008002 A1 | 1/2010 | Sorgeloos |
| 2010/0155775 A1* | 6/2010 | Gauthier et al. ............ 257/173 |
| 2012/0252172 A1* | 10/2012 | Gossner et al. ............. 438/135 |

* cited by examiner

*Primary Examiner* — Zandra Smith
*Assistant Examiner* — Pamela E Perkins
(74) *Attorney, Agent, or Firm* — Wood, Herron & Evans LLP; Anthony Canale

(57) ABSTRACT

Device structures and design structures for a silicon controlled rectifier, as well as methods for fabricating a silicon controlled rectifier. The device structure includes first and second layers of different materials disposed on a top surface of a device region containing first and second p-n junctions of the silicon controlled rectifier. The first layer is laterally positioned on the top surface in vertical alignment with the first p-n junction. The second layer is laterally positioned on the top surface of the device region in vertical alignment with the second p-n junction. The material comprising the second layer has a higher electrical resistivity than the material comprising the first layer.

25 Claims, 6 Drawing Sheets

US 8,692,290 B2

SILICON CONTROLLED RECTIFIER STRUCTURE WITH IMPROVED JUNCTION BREAKDOWN AND LEAKAGE CONTROL

BACKGROUND

The present invention relates to semiconductor device fabrication and, more specifically, to device structures and design structures for a silicon controlled rectifier, as well as methods for fabricating a silicon controlled rectifier.

Chips with complementary metal-oxide-semiconductor (CMOS) devices may be exposed to electrostatic discharge (ESD) events, which can lead to potentially large and damaging ESD currents within the integrated circuit. Shrinking device dimensions have increased the susceptibility of integrated circuits to ESD events. Precautions may be taken by manufacturers, assemblers, and users of integrated circuits to avoid causing ESD events such as incorporating ESD prevention into the integrated circuit. The ESD protection device may prevent damage to the chip during post-manufacture handling until installation on a circuit board and even while the chip is installed on the circuit board. In the absence of an ESD event, the ESD protection device maintains a high-impedance, non-conductive state and is electrically isolated from the protected integrated circuit. If an ESD event is detected, the ESD protection device is configured to change to a low-impedance, conductive state to direct the ESD current to ground and away from the sensitive internal circuits of the chip. The ESD protection device is configured to maintain the conductive state until the ESD current is drained and the ESD voltage is discharged to an acceptable level.

One common type of ESD protection device is a silicon controlled rectifier (SCR), which offers both low capacitance and high failure currents. A silicon controlled rectifier may be constructed in CMOS technologies to provide ESD protection in integrated circuits that include inverters or other logic gates. A silicon controlled rectifier is characterized by a trigger voltage/current and a holding voltage/current, which determine the device responsiveness and effectiveness during an ESD event.

Improved device structures, fabrication methods, and design structures are needed for a silicon controlled rectifier.

SUMMARY

According to one embodiment of the present invention, a device structure is formed using a device region of semiconductor material. The device structure includes a silicon controlled rectifier with a first p-n junction and a second p-n junction each in the device region, a first layer on a top surface of the device region, and a second layer on the top surface of the device region. The first layer is laterally positioned on the top surface of the device region in vertical alignment with the first p-n junction. The second layer is laterally positioned on the top surface of the device region in vertical alignment with the second p-n junction. The first layer is comprised of a first material and the second layer is comprised of a second material with a higher electrical resistivity than the first material.

According to another embodiment of the present invention, a method is provided for fabricating a device structure that includes a silicon controlled rectifier formed in a device region. The method includes forming a section of a first layer on a top surface of the device region and laterally positioned on the top surface in vertical alignment with a first p-n junction of the silicon controlled rectifier, and forming a section of a second layer on the top surface of the device region and laterally positioned on the top surface in vertical alignment with a second p-n junction of the silicon controlled rectifier. The first layer is comprised of a first material and the second layer is comprised of a second material with a higher electrical resistivity than the first material.

According to another embodiment of the present invention, a design structure is provided that is readable by a machine used in design, manufacture, or simulation of an integrated circuit. The design structure includes a silicon controlled rectifier with a first p-n junction and a second p-n junction each in a device region. The design structure further includes first and second layers on a top surface of the device region. The first layer is laterally positioned on the top surface of a device region in vertical alignment with the first p-n junction. The second layer is laterally positioned on the top surface of the device region in vertical alignment with the second p-n junction. The first layer is comprised of a first material and the second layer is comprised of a second material with a higher electrical resistivity than the first material. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIGS. 2A-4A and 2B-4B are respective top and cross-sectional views of the portion of the substrate of FIGS. 1A, 1B at successive subsequent fabrication stages of the processing method.

DETAILED DESCRIPTION

Figure 1A:
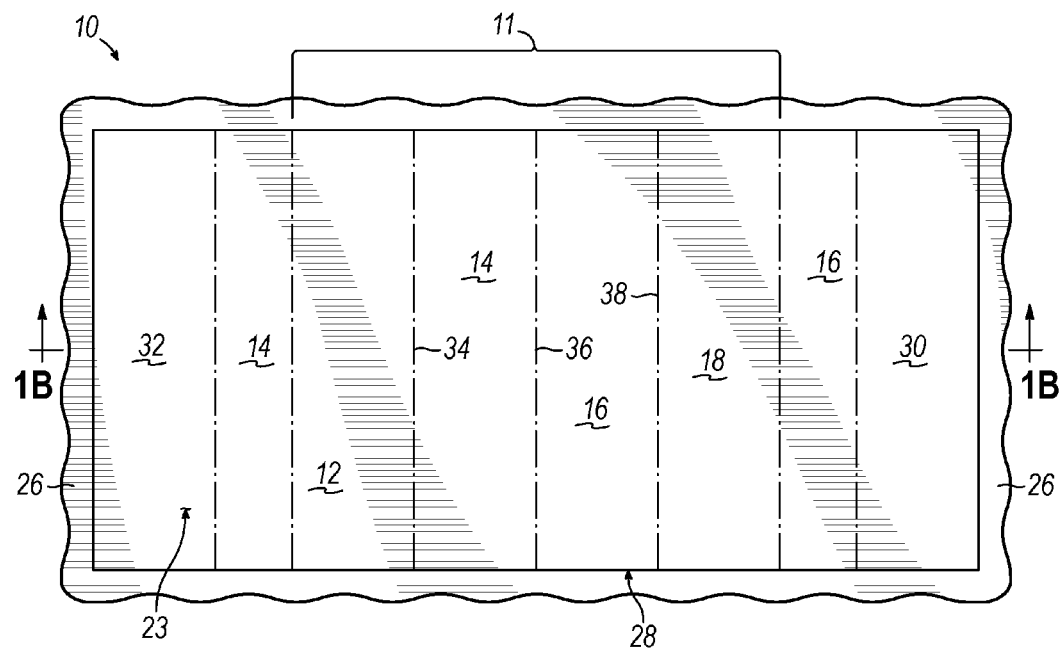
FIG. 1A is a top view of a portion of a substrate at an initial fabrication stage of a processing method in accordance with an embodiment of the invention.
Figure 1B:
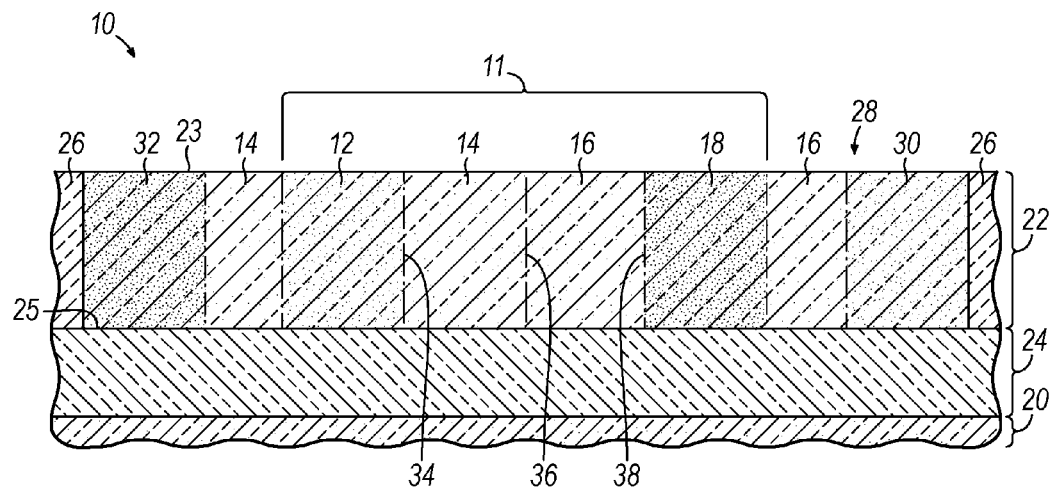
FIG. 1B is a cross-sectional view taken generally along line 1B-1B in FIG. 1A.

With reference to FIGS. 1A, 1B and in accordance with an embodiment of the invention, a device structure 10 for a controlled rectifier (SCR) 11 includes a plurality of doped regions 12, 14, 16, 18 arranged in a four-layer structure and doped to exhibit alternating conductivity types, specifically n-type conductivity and p-type conductivity. As explained below, the SCR 11 may be used in an ESD protection circuit.

The device structure 10 is formed using a substrate, which may be any suitable substrate containing a semiconductor material that a person having ordinary skill in the art would recognize as suitable for the fabrication of an integrated circuit. In the representative embodiment, the substrate may be a semiconductor-on-insulator (SOI) substrate that includes a handle wafer 20, a device or SOI layer 22, and a buried dielectric layer 24 comprised of an insulating material. The buried dielectric layer 24 may be a buried oxide layer containing silicon dioxide (e.g., $SiO_2$). The SOI layer 22 is separated from the handle wafer by the intervening buried dielectric layer 24 and is in direct contact along a planar interface with a top surface 25 of the buried dielectric layer 24. The handle wafer 20 and SOI layer 22 may be comprised of single crystal or monocrystalline semiconductor material, such as single crystal silicon or another semiconductor material that contains primarily silicon. The buried dielectric layer 24 electrically insulates the handle wafer 20 from the SOI layer 22, which is considerably thinner than the handle wafer 20. The SOI substrate may be fabricated by any suitable conventional technique, such as wafer bonding techniques or separation by implantation of oxygen (SIMOX) techniques, familiar to a person having ordinary skill in the art.

Isolation regions 26 are defined by a conventional process in the SOI layer 22 and extend from a top surface 23 of SOI layer 22 to the top surface 25 of the buried dielectric layer 24. In one embodiment, the isolation regions 26 may be fabricated by a shallow trench isolation (STI) process that relies on a conventional lithography and etching process. The STI process may include formation of a patterned hardmask (not shown) on the top surface 23 of SOI layer 22, followed by reactive ion etching (RIE) to form trenches by etching through the SOI layer 22 to the depth of the buried dielectric layer 24. The hardmask may then be removed from the SOI layer 22 using an etching process. The trenches and vias are filled with portions of a blanket layer of a dielectric material. The dielectric material comprising the isolation regions 26 may be an oxide, such as densified tetraethylorthosilicate (TEOS) deposited by thermal chemical vapor deposition (CVD) or a high-density plasma (HDP) oxide deposited with plasma assistance. A polishing process, such as chemical mechanical polishing (CMP), is employed to remove excess dielectric material from the top surface 23 of the SOI layer 22. After planarization, the residual dielectric material disposed inside the trenches defines the isolation regions 26 that bound a device region 28 of the SOI layer 22.

Doped region 14 is formed as a well within the device region 28 and is comprised of semiconductor material of the SOI layer 22 doped to have a first conductivity type. When formed, the doped region 14 may extend between the isolation regions 26 across the full width of the device region 28 or only partially across the device region 28.

Doped region 14 may be formed by forming a patterned ion-implantation mask (not shown) on the top surface 23 of the SOI layer 22 and implanting ions of an impurity species into the device region 28. The ion-implantation mask controls dopant introduction into device region 28 during implantation. The ion-implantation mask may be a resist layer having a window aligned with the device region 28 and may be formed in the ion-implantation mask using a photolithographic patterning process. The implantation conditions (e.g., kinetic energy and dose) for forming the doped region 14 are selected to provide a desired dopant concentration (e.g., light doping) and may include multiple implantation conditions. In a representative embodiment, the doped region 14 may be an n-well comprised of semiconductor material with n-type conductivity formed by implanting ions of a dopant such as phosphorus (P), arsenic (As), antimony (Sb), or other suitable n-type dopant. After ion implantation is complete, the ion-implantation mask is removed by, for example, oxygen plasma ashing or wet chemical stripping.

Doped region 16 is formed as a well within the device region 28 and is comprised of semiconductor material of the SOI layer 22 doped to have a second conductivity type opposite to the first conductivity type. When formed, the doped region 16 may extend only partially across the device region 28 and, depending on the lateral extent of doped region 14, may counterdope a portion of the doped region 14 to provide the opposite conductivity type.

Doped region 16 may be formed forming a patterned ion-implantation mask (not shown) on the top surface 23 of the SOI layer 22 and implanting ions of an impurity species into the device region 28. The ion-implantation mask may be a resist layer having a window aligned with the intended location for doped region 16 and may be formed in the ion-implantation mask using a photolithographic patterning process. The implantation conditions for forming doped region 16 are selected to provide a desired dopant concentration (e.g., light doping) and may include multiple implantation conditions. In a representative embodiment, the doped region 16 may be a p-well comprised of semiconductor material with p-type conductivity formed by implanting ions of a dopant such as boron (B), aluminum (Al), gallium (Ga), or any other suitable p-type dopant. After ion implantation is complete, the ion-implantation mask is removed Doped regions 12, 30 may also be formed in the device region 28 following the formation of doped regions 14, 16. Doped regions 12, 30 are each comprised of semiconductor material of the device region doped to have the first conductivity type. Doped region 12, which is disposed in the doped region 14, has an opposite conductivity type than doped region 14. Doped region 30, which is laterally disposed within the boundaries of doped region 16, has the same conductivity type as doped region 16 and a higher impurity concentration. Each of the doped regions 12, 30 may have a higher impurity concentration and a higher electrical conductivity (i.e., lower electrical resistivity) than the doped region 16.

In the representative embodiment, the doped regions 12, 30 may be concurrently formed with a shared ion implantation process and using the same ion-implantation mask. The ion implantation process forming doped regions 12, 30 may include forming a patterned ion-implantation mask (not shown) on the SOI layer 22 and implanting ions of an impurity species. The ion-implantation mask may be a resist layer having windows aligned with the intended locations for the doped regions 12, 30 and may be formed in the ion-implantation mask using a photolithographic patterning process. The implantation conditions for forming doped regions 12, 30 are selected to provide a desired dopant concentration and may include multiple implantation conditions. In one embodiment, the doped regions 12, 30 may be provided with p-type conductivity by implanting ions of a suitable p-type dopant. After ion implantation is complete, the ion-implantation mask is removed.

Doped regions 18, 32 may also be formed within the device region 28 following the formation of doped regions 14, 16 and either before or after the formation of doped regions 12, 30. Doped regions 18, 32 are each comprised of semiconductor material of the device region 28 doped to have the second conductivity type. Doped region 18, which is disposed in the doped region 16, has an opposite conductivity type than doped region 16. Doped region 32, which is laterally disposed within the boundaries of doped region 14, has the same conductivity type as doped region 14 and a higher impurity concentration. Each of the doped regions 18, 32 may have a higher impurity concentration and a higher electrical conductivity (i.e., lower electrical resistivity) than the doped region 14.

In the representative embodiment, the doped regions 18, 32 may be concurrently formed with a shared ion implantation process. The ion implantation process forming doped regions 18, 32 may include forming a patterned ion-implantation mask (not shown) on the SOI layer 22 and implanting ions of an impurity species. The ion-implantation mask may be a resist layer having windows aligned with the intended locations for the doped regions 18, 32 and may be formed in the ion-implantation mask using a photolithographic patterning process. The implantation conditions for forming doped regions 18, 32 are selected to provide a desired dopant concentration and may include multiple implantation conditions. In a representative embodiment, the doped regions 18, 32 may be provided with p-type conductivity by implanting ions of a suitable p-type dopant. After ion implantation is complete, the ion-implantation mask is removed.

The doped regions 12, 14 define a p-n junction 34 along their vertical plane of intersection across which the conductivity type changes. The doped regions 14, 16 define a p-n junction 36 along their vertical plane of intersection across which the conductivity type changes. The doped regions 16, 18 define a p-n junction 38 along their vertical plane of intersection across which the conductivity type changes. The presence of the three p-n junctions 34, 36, 38 is characteristic of a construction for a silicon controlled rectifier like SCR 11. In the representative embodiment, the SCR 11 has a lateral device construction in which the p-n junctions 34, 36, 38 represent boundary interfaces between regions of opposite conductivity type that are vertically oriented relative to the top surface 23 of the SOI layer 22, the doped region 12 defines a cathode of the SCR 11, and the doped region 18 defines an anode of the SCR 11. In the representative embodiment, the SCR 11 is an NPNP layered structure.

The doped regions 12, 14, 16, 18, 30, 32 may extend vertically in depth from the top surface 23 of the SOI layer 22 to the planar interface between the bottom surface of the SOI layer 22 and the top surface 25 of buried dielectric layer 24. An anneal, such as a rapid thermal anneal, may be employed to electrically activate the implanted impurity species and to alleviate any implantation damage in doped regions 12, 14, 16, 18, 30, 32. Doping mechanisms to modify the electrical conductivity of semiconductor materials by the controlled introduction of impurities into their crystal lattice are understood by a person having ordinary skill in the art.

The doped region 30 provides a body contact, which in the representative embodiment is an n-body contact. The doped region 32 provides a body contact, which in the representative embodiment is a p-body contact. A portion of doped region 14 may separate the doped regions 12, 32. A portion of doped region 16 may separate the doped regions 18, 30. Doped region 30 is laterally positioned between doped region 18 and one of the isolation regions 26 in device structure 10. Doped region 32 is laterally positioned between doped region 12 and another of the isolation regions 26 in device structure 10.

Figure 2A:
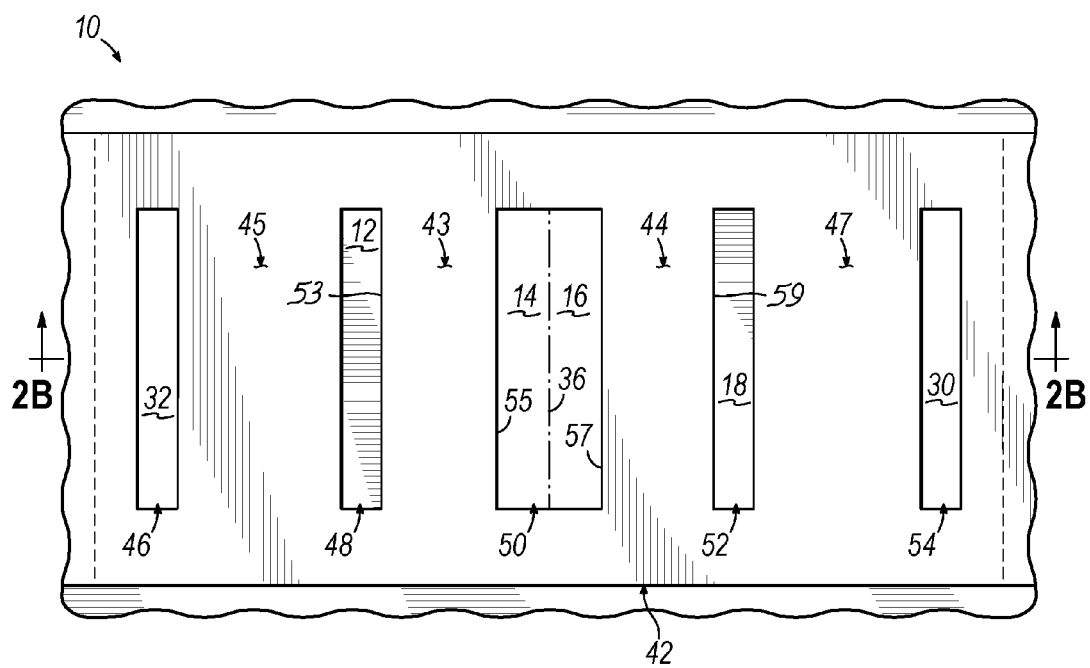
Figure 2B:
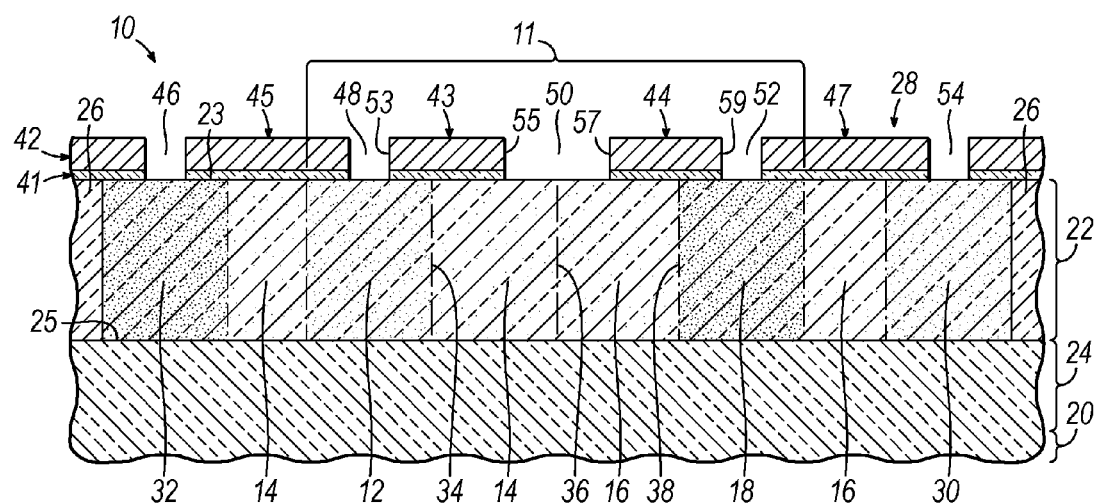

With reference to FIGS. 2A, 2B in which like reference numerals refer to like features in FIGS. 1A, 1B and at a subsequent fabrication stage, the device structure 10 further includes layers 41, 42 deposited on the top surface 23 of SOI layer 22 and patterned using photolithography and etching (e.g., RIE). Layer 41 is in direct contact with the top surface 23 of the SOI layer 22. Gaps 46, 48, 50, 52, 54 are defined in the layers 41, 42 by the patterning process. A surface area of the top surface 23 of the SOI layer 22 is exposed in each of the gaps 46, 48, 50, 52, 54. Layer 42 may have a significantly larger thickness (e.g., twice the thickness or thicker) than layer 41 and a higher electrical conductivity than layer 41. In an alternative embodiment, layer 41 may be omitted from the device construction.

A section 43 of layers 41, 42 is disposed over the p-n junction 34. The section 43 has an edge 53 that borders gap 48 and another edge 55 that borders gap 50 so that the width of section 43 is measured by the distance between the edges 53, 55. Section 43 is laterally positioned on the top surface 23 of SOI layer 22 in vertical alignment with the p-n junction 36 so that p-n junction 36 is laterally positioned between the edges 53, 55. Section 43 is laterally disposed in part on one side of the p-n junction 34 and in part on an opposite side of the p-n junction 34, but does not extend horizontally to vertically overlie the p-n junction 38. However, section 43 of layers 41, 42 is not vertically aligned with the p-n junction 36.

A section 44 of layers 41, 42 is disposed over the p-n junction 38. The section 44 of the layers 41, 42 has an edge 57 that borders gap 50 and another edge 59 borders bounds gap 52 so that the width of section 44 is measured by the distance between the edges 57, 59. Section 44 is laterally positioned on the top surface 23 of SOI layer 22 in vertical alignment with the p-n junction 38 and with p-n junction 38 laterally positioned between the edges 57, 59. Section 44 is laterally disposed in part on one side of the p-n junction 38 and in part on an opposite side of the p-n junction 38. However, section 44 of layers 41, 42 is not vertically aligned with the p-n junction 36.

Sections 45, 47 of the layers 41, 42 are also formed on the top surface 23 when the layers 41, 42 are patterned to form sections 43, 44. Sections 43, 44 are laterally positioned between section 45 and section 47. Gap 50 is disposed between sections 43, 44 of the layers 41, 42 and, more specifically, extends laterally between edge 57 of section 44 and edge 55 of section 43. However, as described above, the locations of the edges 55, 57 are selected such that the p-n junction 36 is not vertically aligned with either of the sections 43, 44 of layer 42 but is instead vertically aligned with the section 60 of layer 56.

In one embodiment, the layers 41, 42 may be formed by complementary metal-oxide-semiconductor (CMOS) processing steps during fabrication of CMOS gate structures at other locations on the SOI substrate. In particular, layers 41, 42 may be comprised of a portion of the gate dielectric and the gate conductor of a CMOS gate stack formed on the top surface 23 and patterned using photolithography and etching. Layer 41 may be comprised of an insulating material (e.g., a non-conductor) appropriate for use in a CMOS gate stack. In one embodiment, the layer 41 may be comprised of an oxide or oxynitride of silicon (e.g., $SiO_2$). If composed of oxide, layer 41 may be a high quality oxide grown by a thermal oxidation process, such as a dry thermal oxidation process using oxygen as the oxidation gas. The insulating material of layer 41 may be also deposited by CVD, atomic layer deposition (ALD), or another conventional deposition technique.

Layer 42 may include one or more layers comprised of a conductor, such as doped polycrystalline silicon (polysilicon) and/or a metal. In one embodiment, layer 42 is comprised of doped polysilicon. In various alternative embodiments, layer 42 may be comprised of tungsten (W), tantalum (Ta), titanium nitride (TiN), zirconium nitride (ZrN), hafnium nitride (HfN), vanadium nitride (VN), niobium nitride (NbN), tantalum nitride (TaN), tungsten nitride (WN), titanium aluminum nitride (TiAlN), tantalum carbide (TaC), tantalum magnesium carbide (TaMgC), tantalum carbonitride (TaCN), a combination or an alloy thereof, or analogous materials recognized by a person having ordinary skill in the art. Layer 42 may be deposited by CVD, ALD, physical vapor deposition (PVD), etc.

Figure 3A:
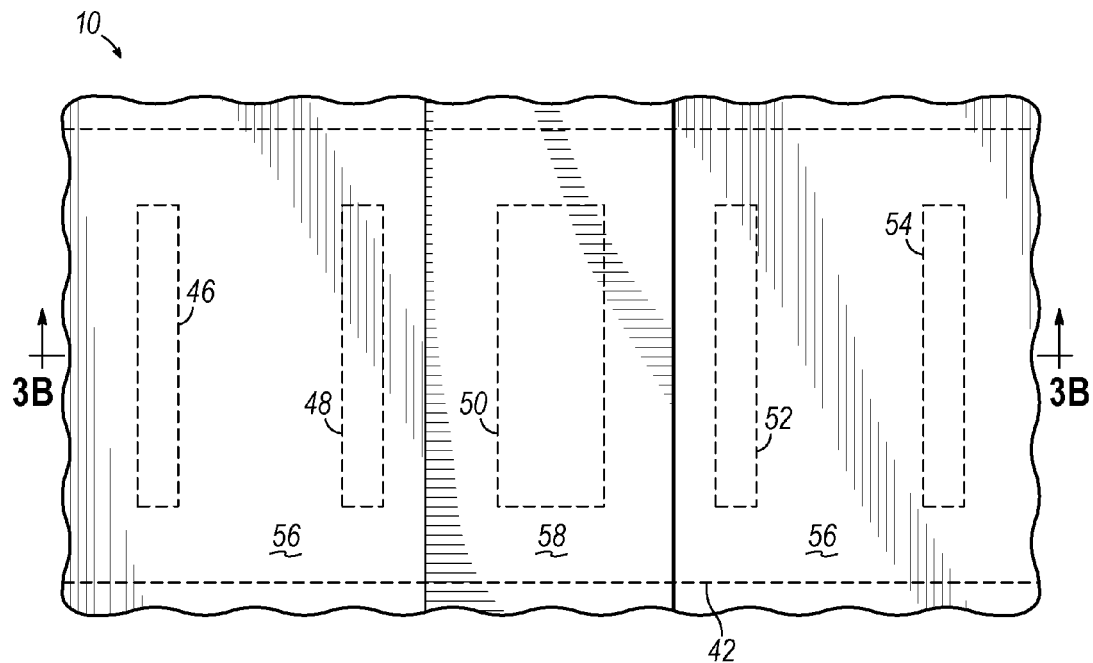
Figure 3B:
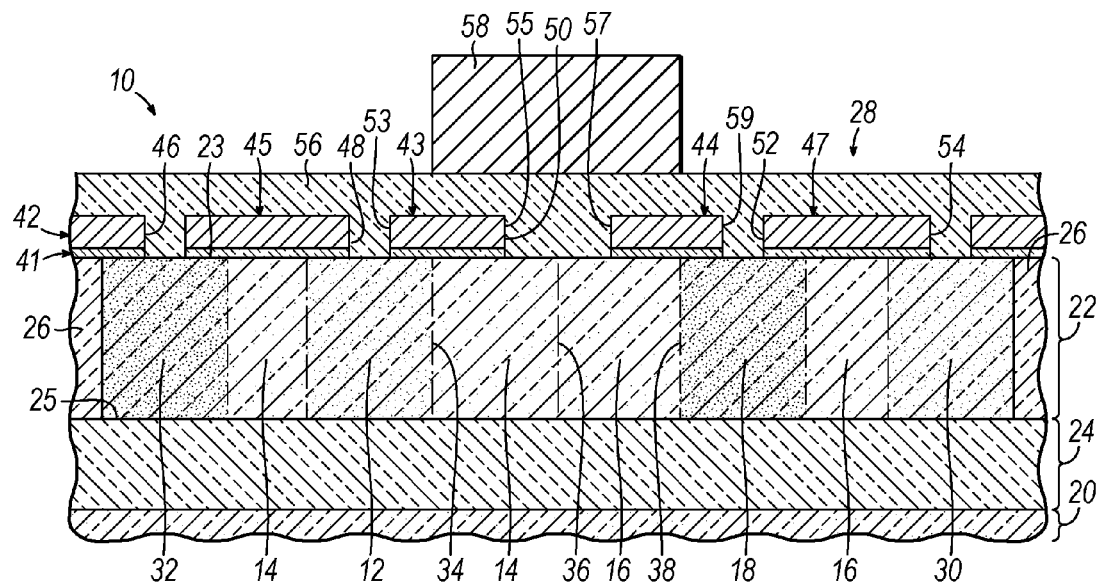

With reference to FIGS. 3A, 3B in which like reference numerals refer to like features in FIGS. 2A, 2B and at a subsequent fabrication stage, the device structure 10 further includes a layer 56 of a material that is deposited on the top surface 23 of SOI layer 22 and over the layers 41, 42 at locations for which a section of layers 41, 42 is covering the top surface 23. After the layer 56 is deposited, a resist layer 58 comprised of a radiation-sensitive organic material is applied by spin coating, pre-baked, exposed to radiation to impart a latent image of a pattern that retains the layer 56 only over the intended surface area correlated with the p-n junction 38 and gap 50 in layers 41, 42, baked, and then developed with a chemical developer. Procedures for applying and lithographically patterning the resist layer 58 using a photomask and lithography tool are known to a person having ordinary skill in the art.

Layer 56 is comprised of a second material different in composition from the first material comprising layer 42 and that has a higher dielectric constant and lower electrical conductivity than the first material comprising layer 42. In one embodiment, layer 56 may be comprised of a layer of a dielectric material that is non-conductive and electrically insulating and, in particular, may be comprised of an oxide, nitride, or oxynitride of silicon. In a representative embodiment, the dielectric material in layer 56 may be comprised of silicon nitride ($Si_3N_4$) or non-stoichiometric silicon nitride ($Si_xN_y$) that is deposited by CVD or PVD. Layer 56 may be composed of a material that is used in a CMOS process as a silicide blocking layer.

Figure 4A:
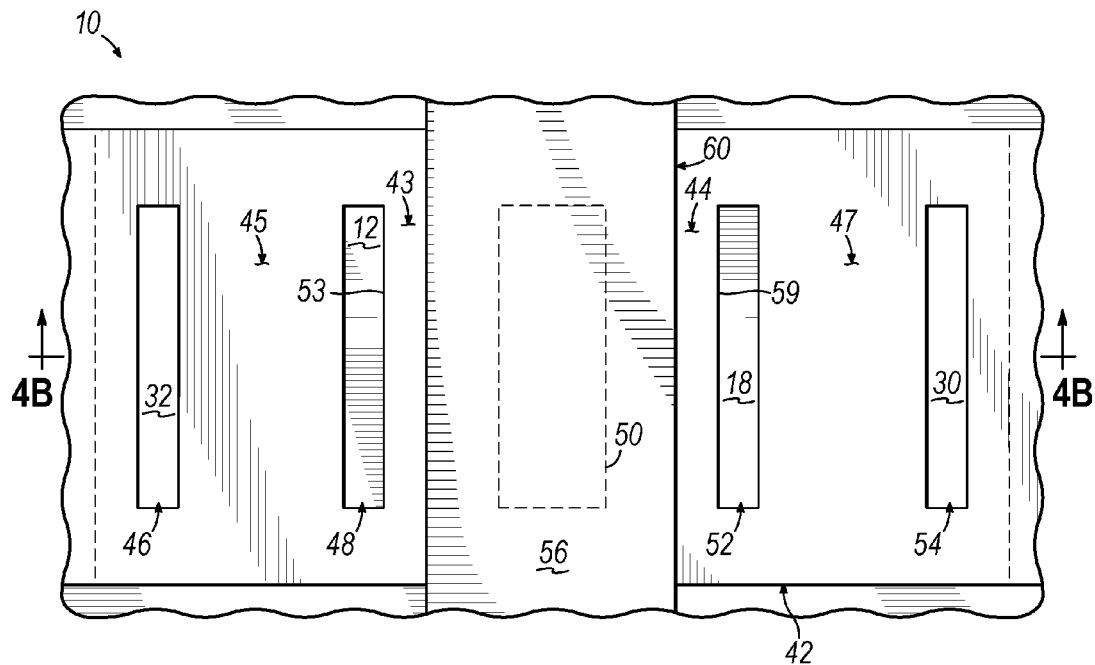
Figure 4B:
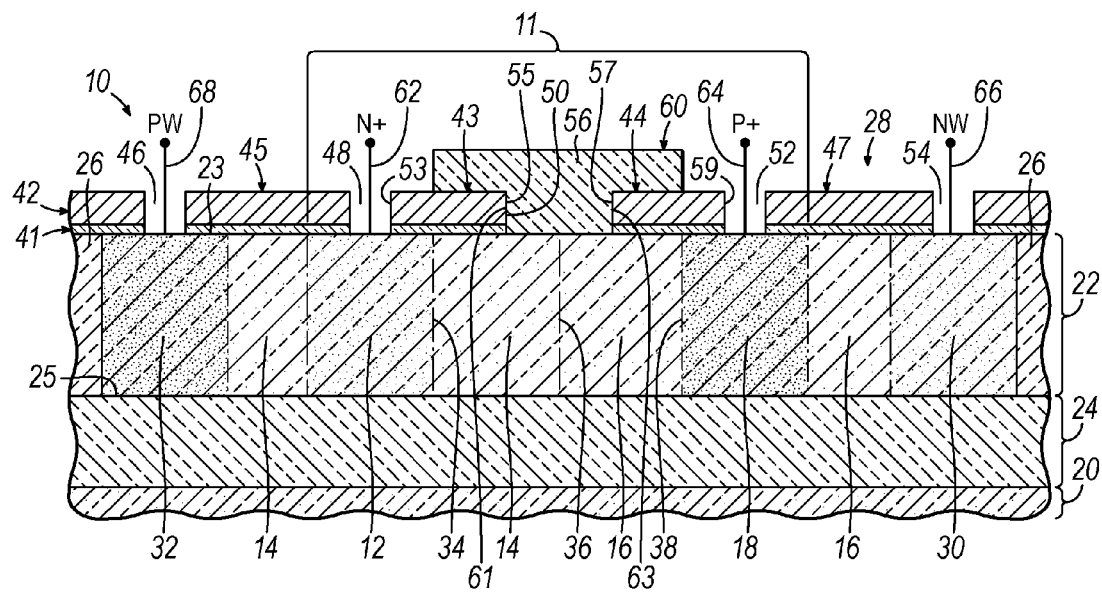

With reference to FIGS. 4A, 4B in which like reference numerals refer to like features in FIGS. 3A, 3B and at a subsequent fabrication stage, layer 56 is patterned using the resist layer 58 as an etch mask. A dry etching process, such as RIE, may be used to remove layer 56 from surface areas unmasked by the resist layer 58. A section 60 of layer 56 remains following the patterning. Section 60 of layer 56 directly contacts the top surface 23 of the SOI layer 22. The resist layer 58 is subsequently removed by oxygen plasma ashing or wet chemical stripping.

In the representative embodiment, section 60 of layer 56 has an edge 61 that is coextensive with the edge 55 of the section 43 of layers 41, 42 and an edge 63 that is coextensive with the edge 57 of the section 44 of layers 41, 42. Section 60 has a width that is measured by the distance between the edges 61, 63 and the p-n-junction 36 is laterally positioned between the edges 61, 63 of section 60. Section 60 of layer 56 is laterally positioned on the top surface 23 of SOI layer 22 in vertical alignment with the p-n junction 36 and, in the representative embodiment, fully occupies the gap 50 between the sections 43, 44 of layers 41, 42. As a result, layer 56 partially overlaps the sections 43, 44 of layers 41, 42 so that the edges 55, 57 are covered. However, the embodiments of the invention are not so limited as the section 60 may be narrower in width than gap 50 so that one or both of the edges 55, 57 is uncovered and separated from the respective one of the edges 61, 63 of section 60.

Due to at least in part to the presence of the sections 43, 44 after layer 56 is deposited and patterned, layer 56 and, in particular, section 60 of layer 56 does not directly overlie the p-n junctions 34, 38. At the least and contingent on the width of section 60, sections 43, 44 of layers 41, 42 represent intervening structures between layer 56 and the top surface 23 of the SOI layer 22. In one embodiment, the width of section 60 is selected such that no portion of section 60 overlies either of the p-n junctions 34, 38.

Standard back-end-of-line (BEOL) processing follows the formation of the device structure 10 to form a BEOL interconnect structure. Each level of the BEOL interconnect structure may be fabricated by damascene processes, such as a dual damascene process in which a dielectric layer is deposited, vias and trenches are etched in the dielectric layer, and the vias and trenches are filled with a conductor using a single blanket deposition followed by planarization. The damascene process is replicated to stack multiple wiring levels so that a multi-level, high density framework of conductive interconnections is formed. Damascene processes and materials used in damascene processes are understood by a person having ordinary skill in the art.

Silicide (not shown) may be formed on surface areas of the top surface 23 of the SOI layer exposed by the gaps 46, 48, 52, 54 and contacts 62, 64, 66, 68 to the silicided surface areas may be formed during the BEOL processing. In particular, contact 64 may be coupled with doped region 12, which represents the cathode of the SCR 11, and contact 66 may be coupled with doped region 18, which represents the anode of the SCR 11. Contacts 66, 68 are coupled with the doped regions 30, 32 of opposite conductivity type to provide respective well contacts.

Figure 5:
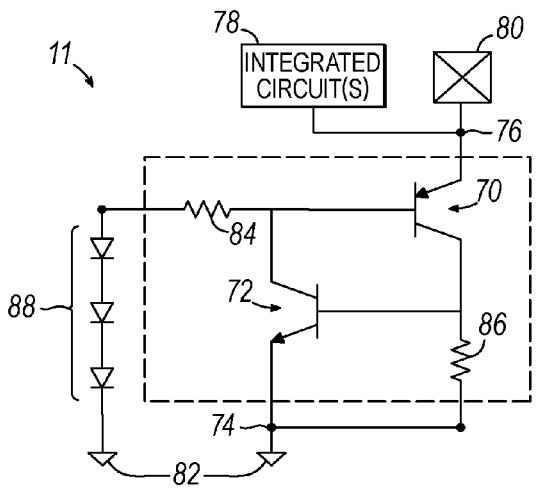
FIG. 5 is a schematic view of the electrical configuration of the device structure of FIGS. 4A, 4B.

With reference to FIG. 5, the SCR 11 (FIGS. 4A, 4B) includes a parasitic PNP bipolar transistor 70 and a parasitic NPN bipolar transistor 72 that are cross-coupled. In the representative embodiment, the PNP bipolar transistor 70 comprises the doped region 18 with heavily-doped p-type conductivity, the doped region 16 with lightly-doped n-type conductivity, and the doped region 14 with lightly-doped p-type conductivity. The NPN bipolar transistor 72 is comprised by the doped region 12 with heavily-doped n-type conductivity, the doped region 14 with lightly-doped p-type conductivity, and the doped region 16 with lightly-doped n-type conductivity. A collector region of the PNP bipolar transistor 70 and a base region of the NPN bipolar transistor 72 are collectively represented by the doped region 14. A base region of the PNP bipolar transistor 70 and a collector region of the NPN bipolar transistor 72 are collectively represented by the doped region 16. Doped region 12 operates as the emitter of the NPN bipolar transistor 72 and, as mentioned above, serves as the cathode 74 of the SCR 11. Doped region 18 operates as the emitter of the PNP bipolar transistor 70 and, as also mentioned above, serves as the anode 76 of the SCR 11.

The SCR 11 may be used to provide ESD protection to the devices of the protected circuit 78 comprising one or more integrated circuits fabricated as a chip on the SOI substrate. To that end, the SCR 11 and the protected circuit 78 are electrically coupled by a shared signal path to the I/O pad 80. More specifically, the anode 76 of the SCR 11 is coupled with the I/O pad 80 and the protected circuit and the cathode 74 of the SCR 11 is coupled to the ground buss at a ground pad 82. The ground pad 82 is grounded when the protected circuit 78 is not powered. The SCR 11 may provide a low-impedance current-carrying path from the I/O pad 80 to the ground pad 82 for the current of an ESD event and, thereby, diverts the current of the ESD event from reaching and damaging the protected circuit 78. The current from the ESD event is directed through the current-carrying path that includes the doped regions 12, 14, 16, 18 of the SCR 11.

In the representative embodiment, the SCR 11 is triggered to discharge the ESD current from a positive mode ESD event at the I/O pad 80 to the ground pad 82. During the positive mode ESD event, the PNP bipolar transistor 70 turns on and the collector current of the PNP bipolar transistor 70 raises the potential of SOI layer 22. In response to the potential of SOI layer 22 reaching approximately 0.7 volts, the NPN bipolar transistor 72 turns on. If the product of the current gains for the bipolar transistors 70, 72 exceeds unity, then the turn-on condition is sustained so that the SCR 11 is latched in the low impedance state and directs the ESD current from the I/O pad 80 through the SCR 11 to the ground buss at ground pad 82. When the chip is in a powered condition during normal operation, the SCR 11 will present a high impedance between the I/O pad 80 and the ground buss at ground pad 82 so that signals communicated over the signal path between the I/O pad 80 and integrated circuit(s) 78 may be relatively unaffected by the presence of the SCR 11.

Doped regions 14, 16 are respectively characterized by electrical resistances 84, 86. The electrical resistance 84 of the doped region 16 is coupled in series with a voltage trigger network, such as a diode string 88, characterized by a triggering voltage and a triggering current that induces the SCR 11 to enter the low impedance state.

The device structure 10 that combines layers 42, 56 of different material characteristics causes the SCR 11 to exhibit improved junction breakdown and leakage control. The section 60 of layer 56, which is comprised of a material having a higher electrical resistivity than the material comprising layer 42, is disposed over p-n junction 38 and operates to reduce or eliminate parasitic leakage at the p-n junction 38. The difference in electrical resistivity between the layers 42, 56 may be at least five orders of magnitude. For example, if layer 56 is comprised of $Si_3N_4$ and layer 42 is comprised of Si, the DC electrical resistivity at 25° C. is approximately $10^{14}$ ohm-cm and the intrinsic electrical resistivity of silicon is $2.3 \times 10^5$ ohm-cm, which is lowered further by impurity doping.

Because at least in part of the lower electrical resistivity of layer 42 in comparison with layer 56, the p-n junctions 34, 38 exhibit a lower leakage current than p-n junction 36. The p-n junctions 34, 38 may also exhibit a higher breakdown voltage than p-n junction 36 primarily due to the presence of layer 41 at the interface between layer 42 and the SOI layer 22. As an example, if layer 41 is comprised of silicon dioxide, the ability to grow layer 41 using a high quality thermal oxidation process may enhance the breakdown voltage for p-n junctions 34, 38 in comparison with p-n junction 36 capped by the section 60 of layer 56 that is formed by a deposition process (e.g., a nitride deposition process if layer 56 is comprised of silicon nitride). In contrast, the use of section 60 of the deposited layer 56 over p-n junction 36 may reduce the parasitic channel leakage in comparison with p-n junctions 34, 38. As a result, the difference in the selection of materials for layers 41, 42 and layer 56 may be used to engineer the properties of the p-n junctions 34, 38.

Figure 6:
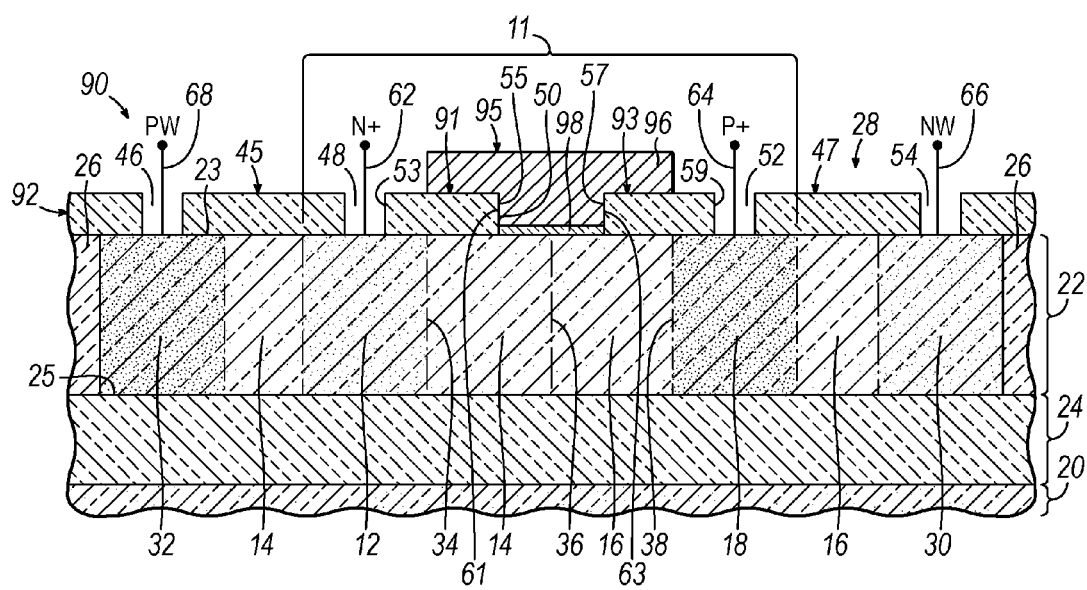
FIG. 6 is a cross-sectional view similar to FIG. 4B of a device structure constructed in accordance with an alternative embodiment of the invention.

With reference to FIG. 6 in which like reference numerals refer to like features in FIGS. 4A, 4B and in accordance with an alternative embodiment, a device structure 90 is similar to device structure 10 but the types of materials in layer 41, 42 and layer 56 are exchanged. In particular, layer 92 is comprised of the material comprising layer 56 and layers 96, 98 are comprised of the materials comprising layer 41, 42. A section 95 of layers 96, 98 is positioned on the top surface 23 of SOI layer 22 in vertical alignment with the p-n junction 36, occupies the gap 50 between the sections 43, 44 of layer 92, and directly contacts the top surface 23 of the SOI layer 22. Sections 91, 93 of layer 92 are respectively positioned on the top surface 23 of SOI layer 22 in vertical alignment with the p-n junctions 34, 38.

Figure 7:
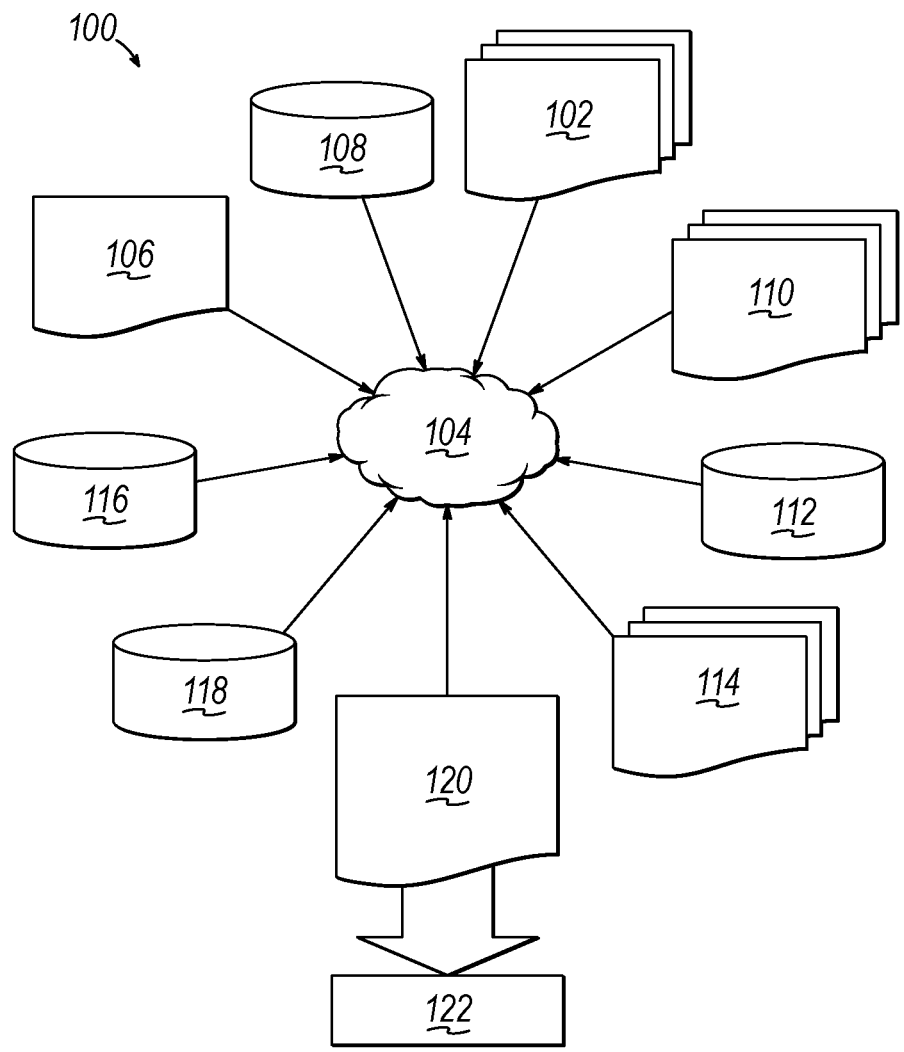
FIG. 7 is a flow diagram of a design process used in semiconductor design, manufacture, and/or test.

FIG. 7 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 4A, 4B, 5 and FIG. 6. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 4A, 4B, 5 and FIG. 6. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 4A, 4B, 5 and FIG. 6 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including Netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 4A, 4B, 5 and FIG. 6. In one embodiment, design structure 120 may comprise a compiled, executable HDL simulation model that functionally simulates the devices shown in FIGS. 4A, 4B, 5 and FIG. 6.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 4A, 4B, 5 and FIG. 6. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure formed using a device region of semiconductor material, the device structure comprising:
   a silicon controlled rectifier including a first p-n junction and a second p-n junction each in the device region;
   a first layer on a top surface of the device region, the first layer having a first section laterally positioned on the top surface of the device region in vertical alignment with the first p-n junction, and the first section of the first layer having a first edge; and
   a second layer on the top surface of the device region, the second layer having a section laterally positioned on the top surface of the device region in vertical alignment with the second p-n junction, and the section of the second layer having a first edge that is coextensive with the first edge of the first section of the first layer,
   wherein the first layer is comprised of a first material and the second layer is comprised of a second material with a higher electrical resistivity than the first material.

2. The device structure of claim 1 wherein the silicon controlled rectifier comprises a plurality of doped regions having a lateral arrangement in the device region and defining the first and second p-n junctions, and further comprising:
   a semiconductor-on-insulator substrate that includes a handle wafer, a semiconductor layer comprising the device region, and a buried dielectric layer separating the handle wafer from the semiconductor layer.

3. The device structure of claim 1 wherein the silicon controlled rectifier comprises a first well and a second well each in the device region, the first well has a first conductivity type, the second well has a second conductivity type opposite to the first conductivity type, and the second p-n junction is defined between the first well and the second well.

4. The device structure of claim 3 wherein the silicon controlled rectifier further comprises an anode in the device region, the anode has the second conductivity type, and the anode and the first p-n junction is defined between the anode and the first well.

5. The device structure of claim 3 wherein the silicon controlled rectifier further comprises a cathode in the device region, the cathode has the first conductivity type, and the first p-n junction is defined between the cathode and the second well.

6. The device structure of claim 1 wherein the silicon controlled rectifier comprises a first well and an anode each in the device region, the first well has a first conductivity type, the anode has a second conductivity type opposite to the first conductivity type and, the second p-n junction is defined between anode and the first well.

7. The device structure of claim 6 wherein the silicon controlled rectifier comprises a second well in the device region, the second well has the second conductivity type, and the first p-n junction is defined between the first well and the second well.

8. The device structure of claim 7 wherein the first p-n junction is defined between the first well and the second well.

9. The device structure of claim 1 wherein the silicon controlled rectifier comprises a first well, a second well, and a cathode each in the device region, the first well and the cathode have a first conductivity type, the second well has a second conductivity type opposite to the first conductivity type, and the second p-n junction is defined between the cathode and the second well.

10. The device structure of claim 1 further comprising:
a third layer comprised of an electrical insulator, the third layer positioned between the first layer and the top surface of the device region.

11. An electrostatic discharge protection circuit comprising:
the device structure of claim 1;
a protected circuit;
a ground pad; and
an input/output pad,
wherein the silicon controlled rectifier includes an anode and a cathode coupled with the ground pad, the anode coupled with of the input/output pad and with the protected circuit.

12. The device structure of claim 2 wherein the buried dielectric layer has a top surface, and the doped regions extend from the top surface of the device region to the top surface of the buried dielectric layer.

13. The device structure of claim 1 wherein the second material is an electrical insulator, and the first material is an electrical conductor.

14. The device structure of claim 1 wherein the second material is silicon nitride, and the first material is doped polysilicon.

15. The device structure of claim 1 wherein the second layer partially overlaps the first section of the first layer so that the first edge of the first section of the first layer is covered.

16. The device structure of claim 1 wherein the first layer has a second section positioned on the top surface of the device region and separated from the first section of the first layer by the section of the second layer.

17. The device structure of claim 16 wherein the silicon controlled rectifier includes a third p-n junction in the device region, and the second section of the first layer is in vertical alignment with the third p-n junction.

18. The device structure of claim 16 wherein the section of the second layer has a second edge, and the second section of the first layer has a second edge that is coextensive with the second edge of the section of the second layer.

19. The device structure of claim 16 wherein the second section of the first layer and the first section of the first layer are separated by a gap, and the section of the second layer is positioned in the gap.

20. The device structure of claim 1 wherein the first section of the first layer has a second edge, and the first p-n junction is laterally positioned between the first edge of the first section of the first layer and the second edge of the first section of the first layer.

21. The device structure of claim 1 wherein the section of the second layer has a second edge, and the second p-n junction is laterally positioned between the first edge of the section of the second layer and the second edge of the section of the second layer.

22. A design structure readable by a machine used in design, manufacture, or simulation of an integrated circuit, the design structure comprising:
a silicon controlled rectifier including a first p-n junction and a second p-n junction each in the device region;
a first layer on a top surface of the device region, the first layer having a section laterally positioned on the top surface of the device region in vertical alignment with the first p-n junction, and the section of the first layer having an edge; and
a second layer on the top surface of the device region, the second layer having a section laterally positioned on the top surface of the device region in vertical alignment with the second p-n junction, and the section of the first layer having an edge that is coextensive with the edge of the section of the first layer,
wherein the first layer is comprised of a first material and the second layer is comprised of a second material with a higher electrical resistivity than the first material.

23. The design structure of claim 22 wherein the design structure comprises a netlist.

24. The design structure of claim 22 wherein the design structure resides on storage medium as a data format used for the exchange of layout data of integrated circuits.

25. The design structure of claim 22 wherein the design structure resides in a programmable gate array.

* * * * *